United States Patent [19]

Hall et al.

[11] Patent Number: 4,827,318
[45] Date of Patent: May 2, 1989

[54] SILICON BASED LIGHT EMITTING DEVICES

[75] Inventors: Dennis G. Hall, Pittsford; Thomas G. Brown, Rochester, both of N.Y.

[73] Assignee: The University of Rochester, Rochester, N.Y.

[21] Appl. No.: 880,378

[22] Filed: Jun. 30, 1986

[51] Int. Cl.[4] .............................................. H01L 27/24
[52] U.S. Cl. ........................................ 357/1; 357/17; 357/63
[58] Field of Search ..................... 357/17, 63, 1, 16, 91

[56] References Cited

U.S. PATENT DOCUMENTS 3,931,631  1/1976  Groves et al. ......................... 357/63
4,684,964  8/1987  Pankove et al. ....................... 357/17

OTHER PUBLICATIONS

J. Weber et al., "Near Band-Gap Photoluminescence From Sulfur-Doped Silicon Samples", *J. Appl* 56(12) 15 Dec. 1984, pp. 3518–3520.
Wolfe et al., Sc. Amer., 250, 3, 98, Mar. 1984.
Weber et al., Phys. Rev. B, 21, 6, 2401, Mar. 1980.
Weber et al., Phys. Rev. B, 25, 12, 7688, Jun. 1982.
Thewalt et al., Sol. St. Comm., 39, 27–30, 1981.
Mitchard et al. Sol. St. Comm, 29, 425–429, 1979.
Watkins, et al., Phys. Rev. B, 29, 10, 5727, May 1984.
Henry, J. Phys C: Solid State Phys, 14, (1981) L255–261.
Brown et al. J. Appl. Phys., 59(4), Feb. 1986, pp. 1399–1401, Not Prior Art to This Invention.
Ennen et al., Appl. Phys. Ltr., 46, 381 (1985).

*Primary Examiner*—James W. Davie
*Attorney, Agent, or Firm*—Martin LuKacher

[57] ABSTRACT

An efficient solid state light emitting device wherein sulphur is used to provide isoelectronic centers in silicon which bind excitons which emit light at a wavelength of 1.32 microns (um) and are particularly adapted for use in integrated opto-electronic circuits and in launching optical signals in single mode optical fibers.

15 Claims, 3 Drawing Sheets

SILICON BASED LIGHT EMITTING DEVICES

The present invention relates to solid state light emitting devices, and particularly to light emitting devices which are based in silicon.

The invention is especially suitable for use in opto-electronic devices such as integrated opto-electronic circuits wherein optical and electronic components are formed on the same substrate by diffusing or implanting an impurity to provide an efficient light emitting component in a manner similar to that in which electronic components are formed in conventional silicon very large scale integrated circuit (VLSI) chips. The invention also is generally useful for providing devices which emit light by photoluminescence and electroluminescence.

Silicon based light emitting devices which are of practical utility have as yet not been developed. Unlike other solid state materials such as gallium arsenide (GaAs), silicon is an indirect band gap material wherein efficient radiative recombination of a conduction-band electron with a valence-band hole is not possible. Some silicon based light emitting devices have been reported which utilize luminescence from rare earth materials doped into silicon. The rare earth material functions as a light emitting material independent of the silicon host. The material reported is erbium which emits only feebly when placed in silicon (See H. Ennen et al., *Appl. Phys. Lett.* 46, 381 (1985)).

Another mechanism whereby photoluminescence and electroluminescence has been reported is the recombination radiation from excitons bound in an isoelectronic trap in silicon. Various materials have been reported as capable of providing isoelectronic binding centers for excitons. Weber et al. have reported such centers in aluminum doped silicon samples (See Weber et al., *Phys. Rev. B*, 21, 2401 (1980)). Thewalt et al. and Mitchard et al. have reported photoluminescence from isoelectronic centers obtained by doping silicon with indium. See Mitchard et al., *Solid State Communications,* 29, 425 (1979) and Thewalt et al., *Solid State Communications* 39, 27 (1981). Weber et al. in *Phys. Rev. B* 25, 7688 (1982) have reported the use of copper doping of silicon crystals which produce photoluminescence from centers in silicon. Watkins et al., *Phys. Rev. B* 29, 5727 (1984) have reported photoluminescence from centers in silicon doped with indium and thallium.

The inventors hereof have reported their work in silicon based light emitting devices wherein silicon crystals doped with indium provide isoelectronic impurities in silicon which bind excitons which emit light. See T. G. Brown and D. G. Hall, *Observation of Electroluminescence From Excitons Bound To Isoelectronic Impurities In Crystalline Silicon, J. Appl. Phys.* 59 (4), 1399 (15 February 1986). This article is by this reference incorporated herein for the method described therein for making silicon based light emitting devices, which except for the use of sulphur instead of indium may be used in fabricating the devices described and claimed herein.

The present invention is based upon the discovery that silicon heavily doped with sulphur provides a light emitting device which may emit light, either by photoluminescence or electroluminescence, by the recombination of excitons bound to isoelectronic centers with practically useful external quantum efficiency and at a wavelength of 1.32 microns (um) which is especially suitable in opto-electronic devices and in launching optical signals into optical fibers. This efficiency is the ratio of the output optical power to the excitation power (either incident pump power which produce photoluminescence or drive current which produces electroluminescence). It may be measured using the excitation density (either incident pump power or drive current) required to achieve given luminescence intensities. External efficiencies from two to five percent, which are practically useful and are comparable to those obtained with direct band gap (GaAs) light emitting devices, are obtainable.

Not all species even if they have the same valence as silicon will create an isoelectronic center capable of binding excitons. In some cases the valence of the impurity which forms such an isoelectronic center does not have the same valence as the host silicon. For example, the mechanism whereby indium forms an isoelectronic center in silicon is not understood. It has been postulated that the indium atoms combine with an atom of an unknown trace material in the silicon to form the center. It is believed that two sulphur atoms combine to make up the impurity complex.

The mechanism of recombination radiation from excitons bound to isoelectronic traps in semiconductors has long been accepted. The mechanism is described qualitatively in an article appearing in the *Scientific American* Vol. 250, page 98 (March 1984). The article is authored by J. P. Wolfe and A. Mysyrowicz and is entitled "Excitonic Matter". Further information respecting the use of isoelectronic impurities in light emitting devices may be found in U.S. Pat. No. 3,931,631 issued Jan. 6, 1976. While excitons can exist in various solid state materials, there is no direct correlation between isoelectronic traps and centers which can bind excitons which emit light upon recombination. The creation of isoelectronic centers in silicon with sulphur which provide light emission with practically useful external quantum efficiency is neither expected nor predictable. Another unexpected result is that sulphur provides much higher binding energy of the exciton which allows the device to work at higher temperatures than where other impurities are used to create isoelectronic traps in silicon. For example, with indium the device must be maintained at approximately 20° Kelvin (K.). The sulphur doped silicon solid state light emitting devices provided in accordance with the invention can operate at higher temperatures. The operating temperature can be increased by increasing the density of the impurity (sulphur level). Room temperature operation is feasible at higher densities. Devices in accordance with the herein described embodiment of the invention can operate at 160° K. and provide maximum luminescence at liquid nitrogen temperatures from 70° to 80° K.

The silicon based light emitting devices provided by the invention can be operated with optical pumps so as to emit light by photoluminescence. In a preferred form electrodes are applied to the device to create an electric field therein so as to emit light by electroluminescence. The binding energy of the sulphur isoelectronic trap enables the exciton to survive and not be quenched in the field before it completes the recombination process and emits light. As mentioned above, the binding energy also allows the completion of the process at high temperatures in spite of thermal effects which tend to destroy the exciton.

The emitted energy at 1.32 microns from the sulphur doped silicon light emitting device has the additional advantage of being at a wavelength where single mode optical fibers have a total material dispersion equal to zero. Optical signal pulses can then be packed closely in time thereby increasing the density of signals which the optical fiber is capable of carrying.

Accordingly it is the principal object of the present invention to provide improved solid state light emitting devices which are based in silicon.

It is a still further object of the present invention to provide a light emitting device utilizing silicon which is capable of emitting light with practically useful external quantum efficiency.

It is a still further object of the present invention to provide an improved solid state light emitting device based in silicon which is capable of efficiently emitting light by electroluminescence and by photoluminescence.

It is a still further object of the present invention to provide an improved silicon based light emitting device which emits at a wavelength where the dispersion of single mode optical fibers is minimal and can be used for the transmission of optical signals closely spaced in time.

BRIEF DESCRIPTION OF THE DRAWING

The foregoing and other objects, features and advantages of the invention will become more apparent from a reading of the following description in connection with the accompanying drawing in which.

DESCRIPTION OF THE PREFERRED EMBODIMENTS

Figure 1:
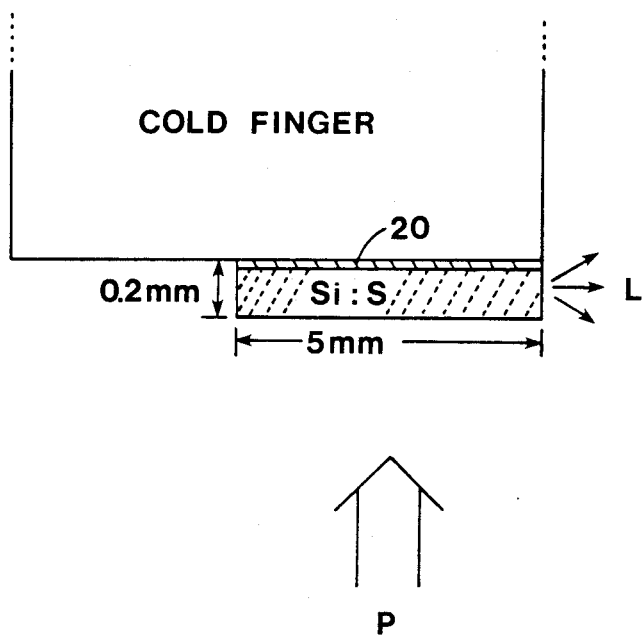
FIG. 1 is an elevational view of a photoluminescent solid state optical device embodying the invention.
Figure 2:
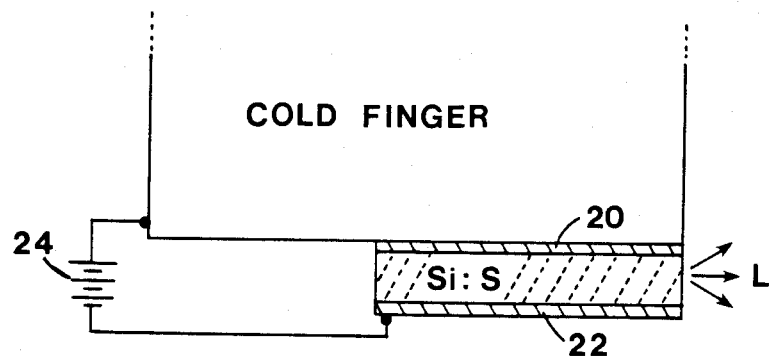
FIG. 2 is an elevational view of a solid state electroluminescent device embodying the invention.

Referring to FIGS. 1 and 2 there is shown a body of silicon which is doped with sulphur. The silicon is a crystal of silicon which is cut into a rectangular shape, for example $3 \times 5 \times 0.2$ millimeters. The doped crystal may be grown (pulled) from a molten bath by the method described by the inventors' above-referenced article. Other methods used may be diffusion or ion implantation. Ion implantation is presently preferred since the depth at which the maximum concentration of impurities is located can be defined in the fabrication process. The luminescence intensity is a function of the number of bound excitons and therefore the concentration of the impurities in the silicon host. A range of dopant sulphur from $10^{15}$ cm$^{-3}$ to $10^{21}$ cm$^{-3}$ is presently preferred. In an exemplary body of sulphur doped silicon (Si:S) the density of the impurity atoms is of the order of $10^{18}$ cm$^{-3}$. While crystalline silicon is presently preferred, the luminescence is from the bound excitons. Accordingly the geometry of the device is not critical. The device may have PN junctions or Schottky barriers where connections are made to the surfaces.

When the device has increased dopant density, room temperature operation (about 20° C.) can be achieved. In order to operate the device at cold temperatures a cold finger can be provided. The device may be operated within refrigeration equipment as described in the inventors' above-referenced article. For cold operation at low dopant density (e.g. $10^{18}$ cm$^{-3}$ and less) the temperature of the device is held in the range of liquid nitrogen temperatures (70° K. to 80° K.). Due to the high binding energy in the excitons at the sulphur isoelectronic traps, the excitons do not collapse due to thermal agitation, and at low density of impurity centers, the temperature can exceed 160° K. However, for maximum luminescence, where low densities of impurity centers are used, liquid nitrogen temperatures are presently preferred. A colloidal silver suspension forms a layer between the Si:S body and the cold finger which provides good thermal and electrical contact. This layer is indicated at 20 in the drawing. It may be over the entire surface of the Si:S body as shown in FIG. 2 or merely opposite to the source of pump power, P as shown in FIG. 1. Where the device is an electroluminescent device as shown in FIG. 2, a silver electrode layer 22 is coated on the surface of the Si:S body opposite to the surface on which the electrode layer 20 is formed. Drive current is provided by a suitable power source which is illustrated schematically as a battery 24.

For photoluminescence a pump laser beam for example, from a krypton (Kr) laser which is of a wavelength of 0.7525 um or any other source of pump power may be used. The pump power may be in the range of 100 microwatts to 10 milliwatts. A luminescence intensity comparable to that using an optical pump may be obtained with electric drive current. The efficiency is less with electrical drive current and has been found to be approximately 40% of the efficiency obtained using the optical pump. Nevertheless practically useful efficiencies are obtained when the device is operated as an electroluminescent device as shown in FIG. 2.

Figure 3:
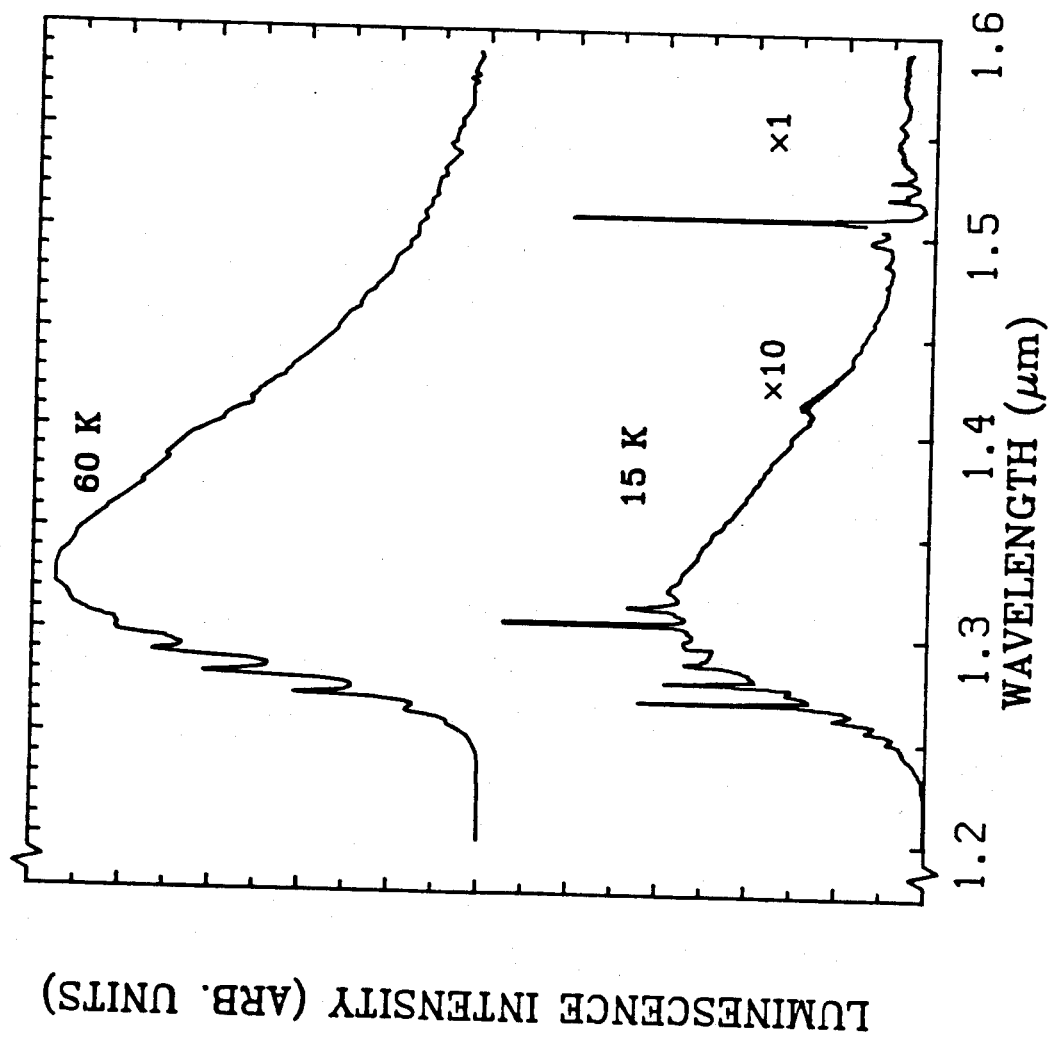
FIG. 3 is a curve showing the spectrum of the luminescence produced by the device shown in FIG. 1 at two temperatures.

The energy which is produced upon recombination of the excitons is within the energy band gap of silicon where it is transparent. The sulphur impurities provide maximum luminescence at 1.32 microns as shown in FIG. 3.

Devices as shown in FIG. 2 are especially suitable for use in integrated opto-electronic circuits where optical and electronic components are integrated on the same substrate. Unlike III-IV (e.g., GaAs) integrated optoelectronic devices where the different alloys must be grown on the chip to prevent light generated in one optical component from being absorbed in another, the silicon based opto-electronic devices utilizing light emitting components provided by the invention may be formed by diffusing or implanting into the silicon substrate the sulphur impurity at the locations where light emission is desired. Therefore similar techniques as are used to make silicon integrated circuit chips may be used in providing integrated opto-electronic circuits utilizing light emitting components in accordance with the invention.

From the foregoing description it will be apparent that there has been provided improved light emitting devices based in silicon. Variations and modifications of the herein described devices, within the scope of the invention, will undoubtedly suggest themselves to those skilled in the art. Accordingly the foregoing description should be taken as illustrative and not in a limiting sense.

We claim:

1. A luminescent device comprising a body of silicon doped with sulphur to form isoelectronic centers at which excitons are bound which luminesce at a wavelength of 1.32 um with quantum efficiency of at least a few percent.

2. The device according to claim 1 where said body of silicon is a silicon crystal.

3. The device according to claim 1 wherein the concentration of sulphur is in the range of $10^{15}$ cm$^{-3}$ to $10^{21}$ cm$^{-3}$.

4. The device according to claim 1 wherein said concentration of sulphur is about $10^{18}$ cm$^{-3}$.

5. The device according to claim 2 wherein said crystal is grown from a molten silicon and sulphur bath.

6. The device according to claim 2 wherein said body is doped by diffusion of sulphur therein.

7. The device according to claim 2 wherein said body is doped by ion implantation of said sulphur therein.

8. The device according to claim 1 wherein said luminescence is photoluminescence and means are provided for pumping said doped body with optical energy.

9. The device according to claim 1 wherein said luminescence is electroluminescence and means are provided for providing an electric field in said body.

10. The device according to claim 9 wherein said electric field applying means comprises electrodes on said body and means connected to said electrodes for passing current through said body.

11. The device according to claim 1 further comprising means for operating said device at a temperature which is a function of the density of the impurity centers in said body.

12. The device according to claim 11 wherein said operating means comprises means for maintaining said body at a temperature sufficient to prevent the collapse of the exciton before luminescence is produced.

13. The device according to claim 1 wherein said body has a sufficiently high concentration of sulphur to provide a sufficiently high concentration of said centers to provide luminescence from said excitons at room temperature.

14. The device according to claim 1 further comprising means for maintaining said body at a temperature below 160° K.

15. The device according to claim 11 wherein said temperature maintaining means is operative to maintain the temperature of said body between 70° K. and 80° K.

* * * * *